United States Patent [19]

Autenrieth et al.

[11] Patent Number: 5,199,868
[45] Date of Patent: Apr. 6, 1993

[54] CONTINUOUS FURNACE

[75] Inventors: Hans Autenrieth; Manfred Hampl, both of Blaubeuren; Werner Kling, Senden; Dieter Link, Ehingen; Rolf Hartung, Blaubeuren, all of Fed. Rep. of Germany

[73] Assignee: Centrotherm Elektrische Anlagen GmbH & Co., Blaubeuren, Fed. Rep. of Germany

[21] Appl. No.: 646,764

[22] PCT Filed: May 22, 1990

[86] PCT No.: PCT/DE90/00376
§ 371 Date: Jan. 10, 1991
§ 102(e) Date: Jan. 10, 1991

[87] PCT Pub. No.: WO90/14184
PCT Pub. Date: Nov. 29, 1990

[30] Foreign Application Priority Data
May 24, 1989 [DE] Fed. Rep. of Germany ....... 3916922

[51] Int. Cl.$^5$ ................................ F27B 9/28
[52] U.S. Cl. .......................................... 432/59; 432/5; 432/8; 34/105
[58] Field of Search ................... 432/8,5, 59.6; 34/105

[56] References Cited

U.S. PATENT DOCUMENTS

| | | |
|---|---|---|
| 3,711,961 | 1/1973 | Spiegel et al. .................. 34/105 |
| 3,779,696 | 12/1973 | Poore et al. .................. 432/5 |
| 4,065,251 | 12/1977 | Croft et al. .................. 432/59 |
| 4,080,158 | 3/1978 | Kondo et al. .................. 432/8 |
| 4,408,986 | 10/1983 | Soraya et al. .................. 432/59 |

FOREIGN PATENT DOCUMENTS

| | | |
|---|---|---|
| 0132229 | 6/1986 | European Pat. Off. . |
| 750820 | 1/1945 | Fed. Rep. of Germany . |
| 8701090.9 | 4/1987 | Fed. Rep. of Germany . |
| 2057107 | 3/1981 | United Kingdom . |

*Primary Examiner*—Henry C. Yuen
*Attorney, Agent, or Firm*—Herbert Dubno

[57] ABSTRACT

The continuous furnace serves for the simultaneous two-sided sintering of sintered sheets upon substrates. It has a muffle and a conveyor belt longitudinally traversing the muffle and carrying the substrates and consisting of a pair of individual belts which are guided in parallel next to each other and synchronously. The belt surfaces are mutually inclined at a small angle to the horizontal in the muffle. The substrates which are self-supporting between two parallel lateral edges, lie with one lateral edge on the belt surface of one individual belt and with the second lateral edge on the belt surface of the other individual belt, so that the bottom side of the substrate does not touch the individual belts.

7 Claims, 9 Drawing Sheets

CONTINUOUS FURNACE

CROSS REFERENCE TO RELATED APPLICATIONS

This application is a national phase of PCT/DE/90/00376 filed May 22, 1990 and based upon German National Application P 39 16 922.7 filed May 24, 1989 under the International Convention.

FIELD OF THE INVENTION

The invention relates to a continuous furnace for the simultaneous two-sided sintering of sintered layers upon substrates, particularly for producing thick-film integrated circuits, the furnace having a muffle and a drivable conveyor belt supporting the substrates and longitudinally traversing the muffle, this belt being endlessly led back outside the muffle.

BACKGROUND OF THE INVENTION

In the known continuous furnaces of this kind, the conveyor belt forms in the muffle a plane support surface for the substrates. Because quality can be compromised during sintering due to the surface contact between the sintered layers and the conveyor belt, specially designed carrier devices are required for the substrates, which hold the substrates at the edges freely suspended above the conveyor belt. This permits this way making sintering without surface contact even for bottom-side layers. However, the disadvantages of these carrier devices are considerable, since the format can vary only within very narrow limits. The carriers are also partially exposed to heavy wear by high temperatures. The mass of the carrier can influence the sintering temperature profile or the temperature buildup time, and they cannot be operated with the usual automatic substrate loading systems.

OBJECT OF THE INVENTION

It is an object of the invention to provide an improved continuous furnace of the aforementioned kind, so that in the case of two-sided substrate coating, the sintering process can be carried out just like in the case of one-sided coating of substrates, thus preserving for the two-sided substrate coating process the advantages of the known sintering process for one-sided coating of substrates, such as format flexibility, elimination of carrier devices and the use of standard substrate loading systems.

SUMMARY OF THE INVENTION

This object is attained in accordance with the invention by providing the mutually facing inner edges of the individual belts are so that they run lower than the outer edges facing away from each other The substrates which are self-supporting between two parallel lateral edges lie with one lateral edge on the belt surface of one of the individual belts and with the other lateral edge on the belt surface of the other individual belt.

As a result, the individual belts with their inclined belt surfaces, when seen in cross section, form an approximately V-shaped opening angle, so that the substrates rest only with their lateral edges on the individual belts and remain untouched at their bottom coating side. The self-supporting arrangement of the substrates includes the possibility of separate process gas flows for the top side of the substrate and for its bottom side. The possibility of simultaneous two-sided sintering of coatings on a substrate reduces the production costs almost by one half. Furthermore, other cost advantages result from the possibility to process substrate sizes over a wider range and from the elimination of the carrier devices The automatic loading and unloading of the conveyor belt from and into storage can be rationally performed by already existing and proven devices.

Suitably, both individual belts are inclined with respect to the horizontal by equal angles, so that they form a symmetric arrangement with respect to the vertical median when, in addition thereto, the two individual belts have the same width. The inclined belt surfaces of the two individual belts can define between them an opening angle between 80° and 170°.

Preferably, in the muffle, the inclined belt surfaces of both individual belts each constitute a plane surface. In a further preferred embodiment, the muffle has mutually inclined muffle bottoms, just like the mutually inclined belt surfaces of the individual belts, the individual belts being supported and guided on these bottoms. The muffle bottoms which thus support the individual belts against their own weight while in the muffle, are also advantageously plane surfaces.

It is further advisable to laterally support the two individual belts at the mutually facing inner edges of their inclined belt surfaces, in order to avoid lateral displacement of the individual belts in the direction of the inclination of their belt surfaces For this purpose, the two individual belts can rest against each other or can be supported by an independent support member arranged between the individual belts and independently guided thereon, at their mutually facing inner edges of their inclined belt surfaces The support member can also serve the process gas flow. For this purpose, in a first preferred embodiment, the support member, seen in cross section, is built as single- or multi-chamber channel, for the feeding or evacuation of process gas, whereby gas passage openings are provided in the walling of the channel. According to another embodiment the support member carries a channel with one or several chambers seen in cross section, for the supply and evacuation of process gas, whereby again openings for the passage of the gas are provided in the channel walling. In any case, the substrates lying on the individual belts on both sides of the support member, are self-supportingly extending above the support member.

Another arrangement for the guidance of the process gas is characterized in that underneath the muffle bottoms, the muffle forms a hollow space, which in cross section can have one or several chambers, for the supply and evacuation of the process gas and that in the muffle bottoms openings for the passage of the gas are provided. As a result, it is possible to separate the gas supply for the top side and for the bottom side of the substrate.

While in the area of the top side of the substrate, the process gas flow takes place in the known manner, in the area of the bottom side of the substrate, the supply and evacuation of the process gas takes place over a single-chamber or multi-chamber hollow space of the muffle and/or over the single-chamber or multi-chamber channel formed or carried by the support member. Particularly, it is possible to supply the process gas through that channel and to evacuate the process gas through the hollow space in the muffle.

Preferably, the individual belts run over horizontally supported cylindrical guide rollers, which are arranged at a distance, in front and behind the muffle, whereby the belt surface of each individual belt is twisted between the horizontal position at the guide roller and the inclined position in the muffle around its neutral longitudinal axis, which in successive belt cross sections connects the cross-sectional centers of gravity. Then, the twisting or winding of the belt surface generates only very little additional tensile stress in the individual belts and, at the same time, the twisting, respectively winding of the individual belts can take place as a result of their own weight. It is particularly advisable in such an arrangement that common guide rollers be provided for the two individual belts and that the two neutral axes of the individual belts run in a common plane, tangential to the plane of the shell of the guide rollers. The twisting, respectively winding of the belt surfaces can be further assisted by guiding the individual belts in the area of the twisting of their belt surfaces, between the guide rollers and the muffle, over additionally provided cylindrical rollers and/or fixed guiding devices, arranged according to the respective inclination of the belt surface. Further, we can provide drive, guide and or support rollers with horizontally positioned axes in the empty belt (reverse run) of the individual belts. The drive-, guide- and/or support rollers in the empty belt zone can have flange rings or spacer rings laterally guiding the individual belts at their belt edges. It is also possible to provide fixed guiding devices in the area of the drive, guide and/or support rollers arranged in the empty belt zone, especially for the lateral guiding of the individual belts.

Also, instead of twisting or winding the individual belts with respect to the belt surface, between the muffle and the guide rollers provided before and after the muffle, it is possible within the framework of the invention to arrange all drive- guide- and/or support rollers guiding each individual belt inside the muffle, with their axes inclined at the same angle as the belt surface with respect to the horizontal, so that the axes of the rolls or rollers arranged at both individual belts in mutually corresponding pairs define between them the same opening angle as the belt surfaces in the muffle. Thereby, the drive-, guide- and/or support rolls or rollers are suitably provided with flange rings, which support and laterally guide the individual belts at least at their mutually facing inner edges.

The invention is not limited to continuous furnaces with only one pair of individual belts inclined towards each other. Within the framework of the invention, also pairs of individual belts, running next to each other, can form the conveyor belt of the continuous furnace. Suitably, in these cases in the muffle for each pair of belts a separate muffle chamber is provided.

BRIEF DESCRIPTION OF THE DRAWING

The above and other objects, features and advantages of my invention will become more readily apparent from the following description, reference being made to the accompanying highly diagrammatic drawing in which.

DESCRIPTION

Figure 1:
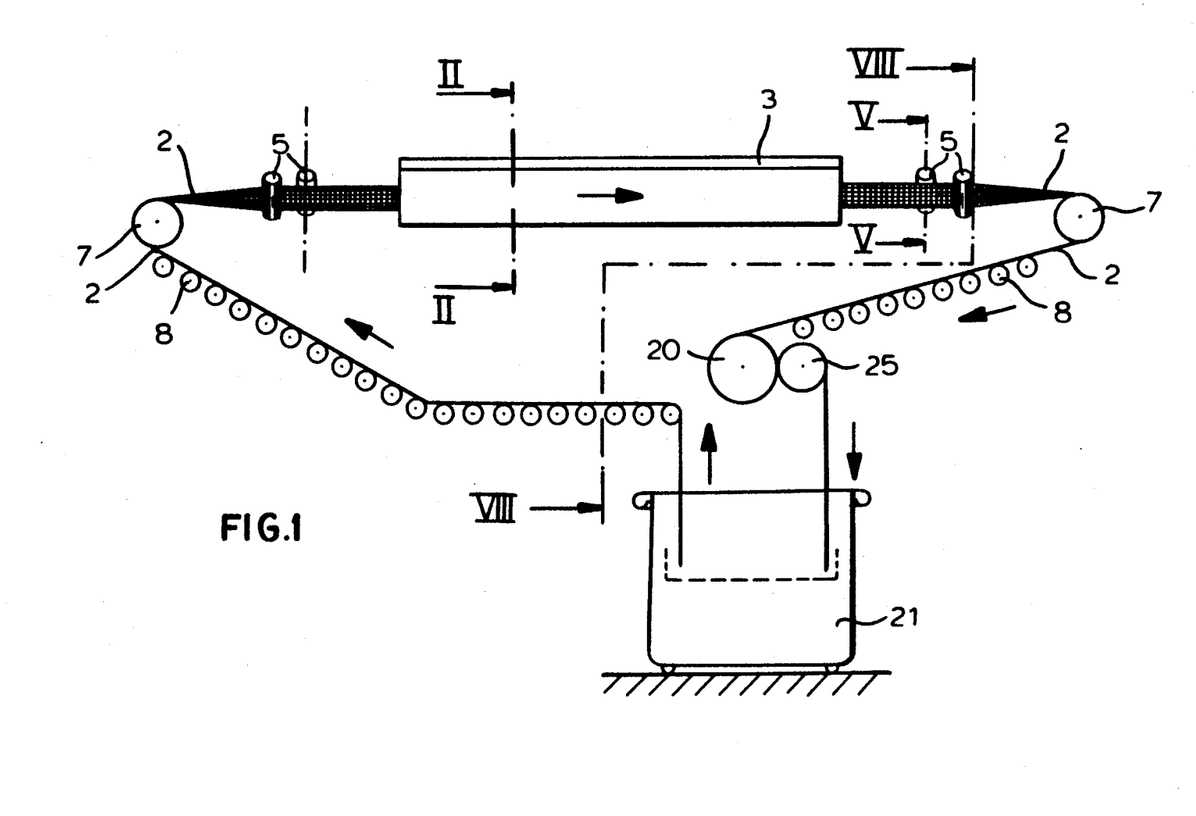
FIG. 1 is a schematic side elevational view of a continuous furnace according to the invention.

The continuous furnace shown in the drawing serves for the simultaneous two-sided sintering of sintered layers upon substrates 1, particularly for the production of thick-film integrated circuits. Of the oven, basically, only the muffle 3, without details referring to the heating system and the process gas flow, and the conveyor belt longitudinally traversing the muffle and carrying the substrate 1, is represented. Outside the muffle, the belt is being endlessly returned to the same run and drivable by means also not shown in detail, for instance via a drive roller 20. The conveyor belt can be of the known netted link belt type. The belt is passed in FIG. 1 through an ultrasound cleaning tank 21, whereby for the sake of simplicity, the system guiding the conveyor belt through the cleaning tan is not shown.

Figure 5:
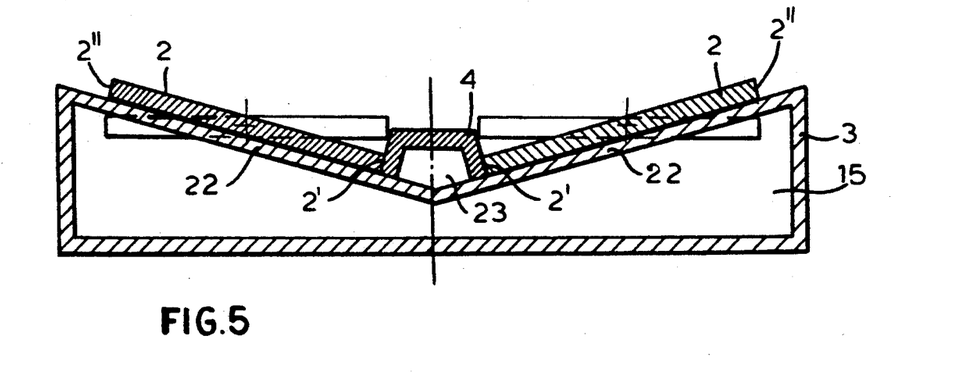
FIGS. 5 to 7 are sections along the line V—V in FIG. 1, also for in various embodiments of the continuous furnace.
Figure 6:
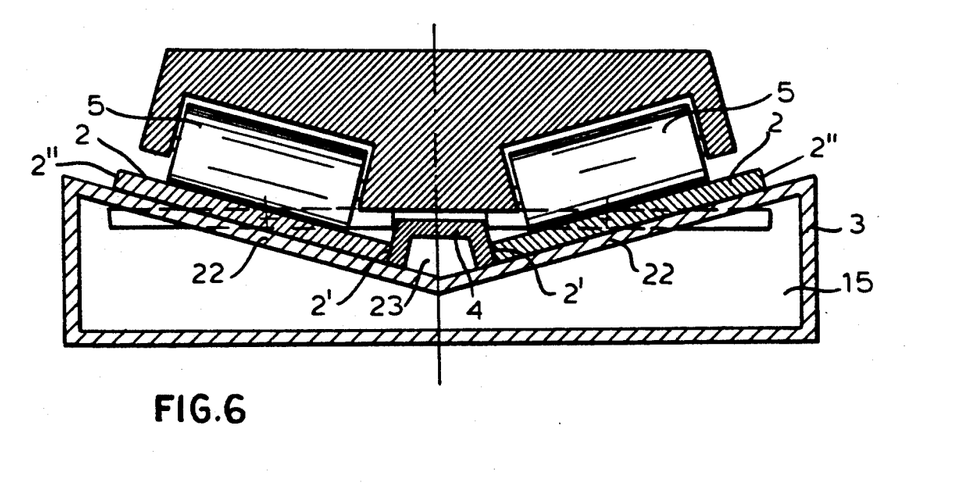
Figure 7:
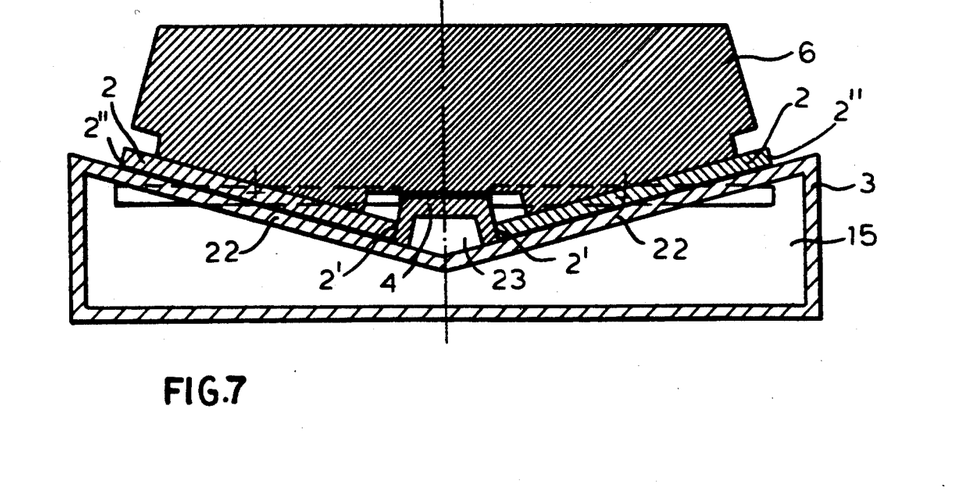
Figure 8:
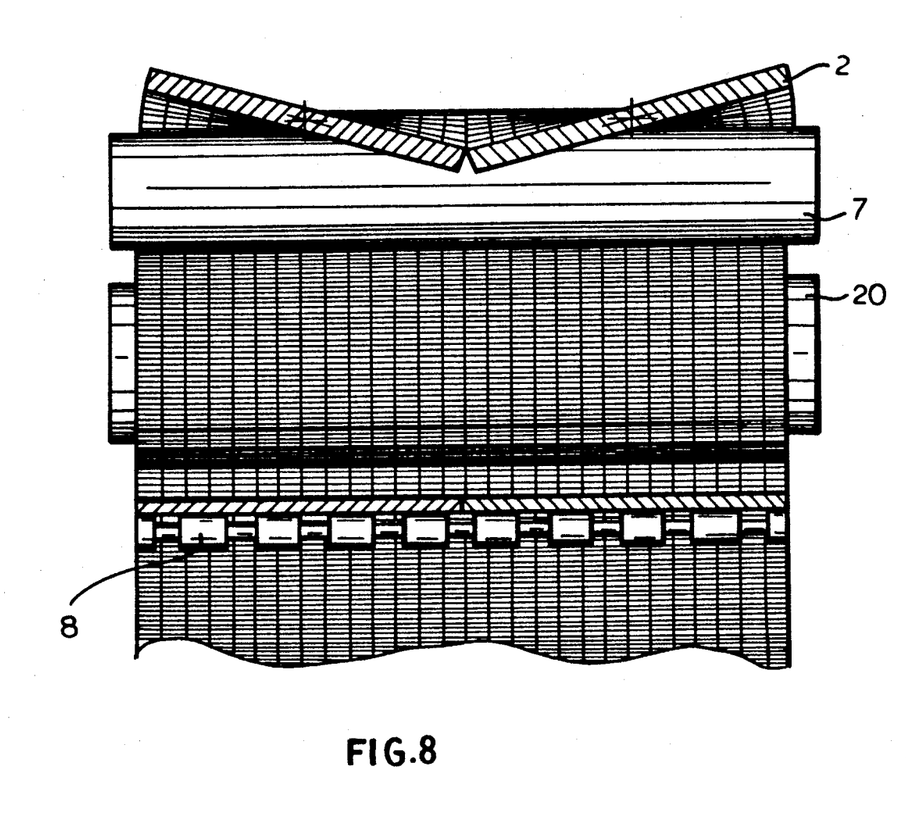
FIGS. 8 to 11 are sections along line VII—VII in FIG. 1, again for in various embodiments of the furnace.
Figure 9:
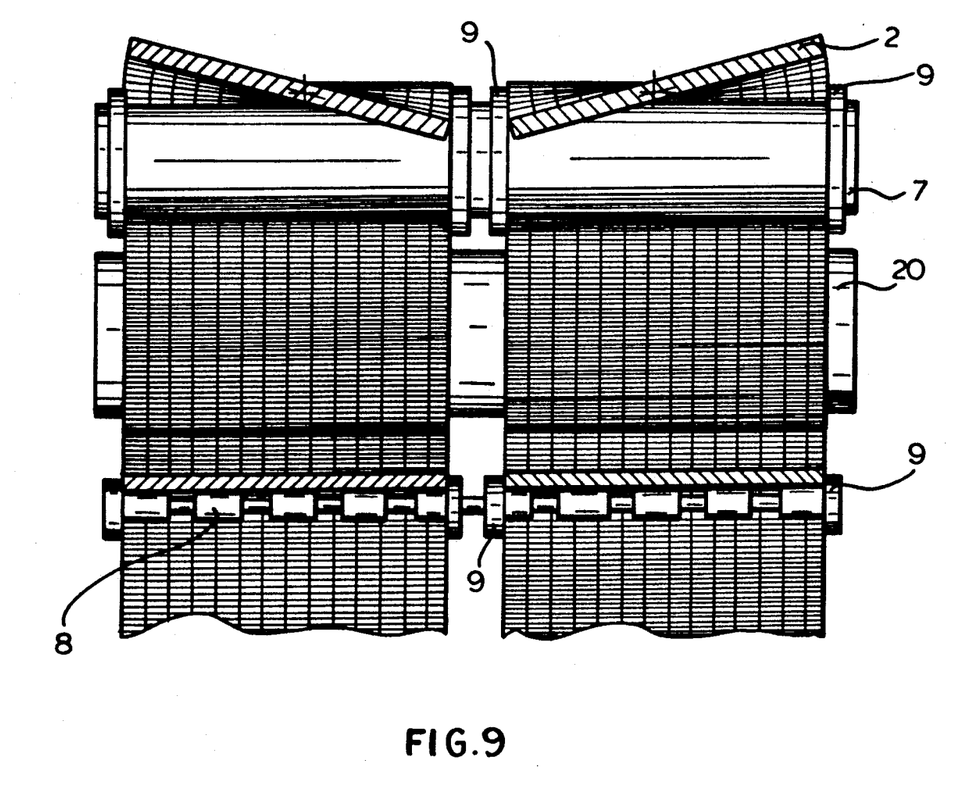

The conveyor belt consists of a pair of parallel and synchronously running individual belts 2. In the muffle 3 (FIGS. 2 to 4), the belt surfaces of these individual belts are mutually inclined at a small angle, whereby this inclination of the belt surfaces is imported in front of and behind the muffle 3 (FIGS. 5 to 7) in that area wherein the substrates 1 are fed to and discharged from the conveyor belt by means of devices which are not shown in the drawing. As a result of the mutual inclination of the belt surfaces, the inner edges 2' facing each other of the individual belts 2 run at a deeper level than the outer edges 2" facing away from each other. Thus, in cross section, the two individual belts 2 have the configuration of an upwardly open V, so that at their bottom side the substrates 1 are free and have no contact with the individual belts 2, when these substrates lie self-supportingly between the two parallel lateral edges 1', with one lateral edge on the belt surface of one individual belt and with the second lateral edge on the surface of the second individual belt. In this embodiment, the V-configuration formed in cross section by the two individual belts 2 is symmetrical. Hence, both individual belts 2 are inclined by the same angles of the same size with respect to the horizontal and both individual belts have the same width.

Figure 3:
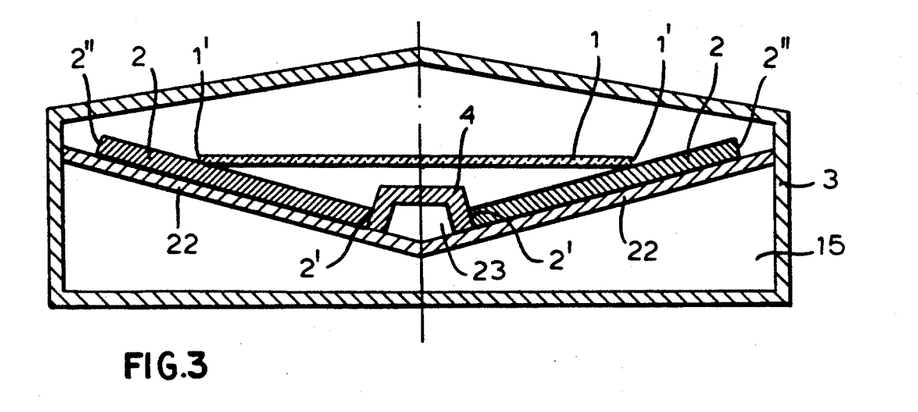

The inclined belt surfaces of the two individual belts 2 can include between them an opening angle of 80° to 170° and in any case each forms in the muffle 3 a plane surface. Just like the belt surfaces of the individual belts 2, the muffle 3 has mutually inclined muffle bottoms 22, on which the individual belts are supported and guided and which continue up to the supply and discharge areas in front and behind the muffle 3. These muffle bottoms 22 are each also built with plane surfaces, which carry the individual belts 2.

Figure 2:
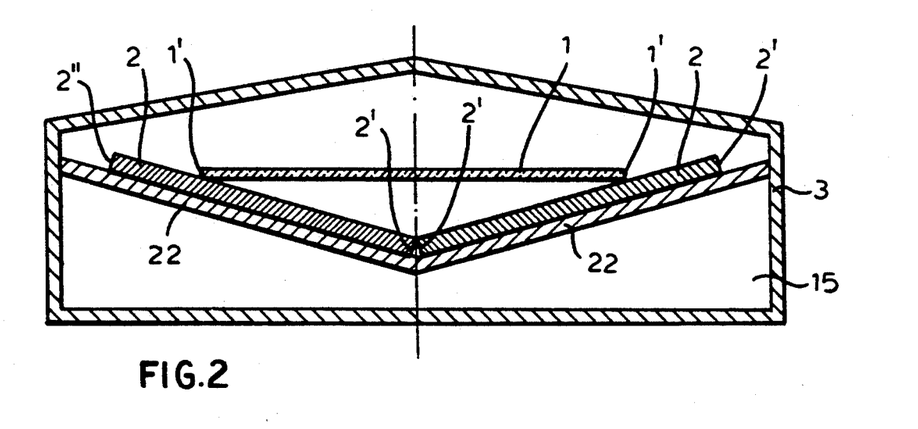
FIGS. 2 to 4 and 12 to 15 are sections taken along the line II—II in FIG. 1 in various embodiments of the continuous furnace.

As in FIG. 2, the two individual belts 2 can directly rest against each other at their mutually facing inner edges 2' of their inclined belt surfaces.

However, as shown in FIGS. 3 to 7 and 13, 14, it is also possible to have the two individual belts 2 supported at their mutually facing inner edges 2' of their inclined belt surfaces by a support member 4 provided between the individual belts and have each of them individually guided thereon. The support member 4 is arranged on the muffle bottoms 22 and offers the possibility to achieve separate process-gas guidance on the top side and the bottom side of the substrates 1 Besides, as shown in cross section in FIGS. 3 and 5 to 7, as well as 14, the support member 4 can be designed as single-chamber or antechambers channels 23, for the supply and evacuation of the process gas, whereby in the channel wall gas passage openings 14' (FIG. 13) are provided.

Figure 4:
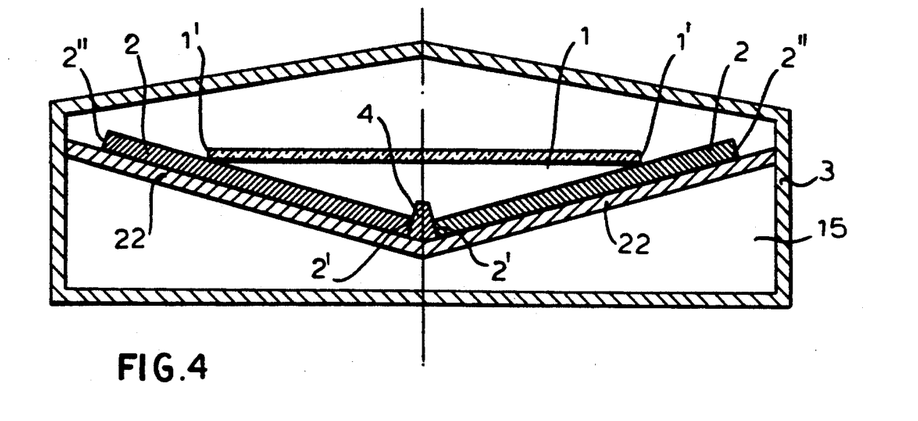
Figure 14:
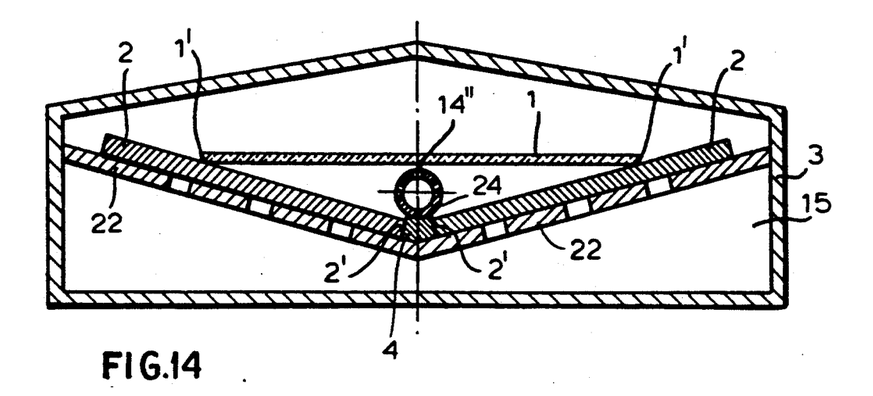

There is also the possibility indicated in FIGS. 4 and 14 to use the support member 4 as a support of a thereon provided channel 24, which seen in cross section can be a single-chamber or antechamber channel and which again serves for the supply and evacuation of the process gas and for this purpose has passage openings 14" for the gas.

Figure 12:
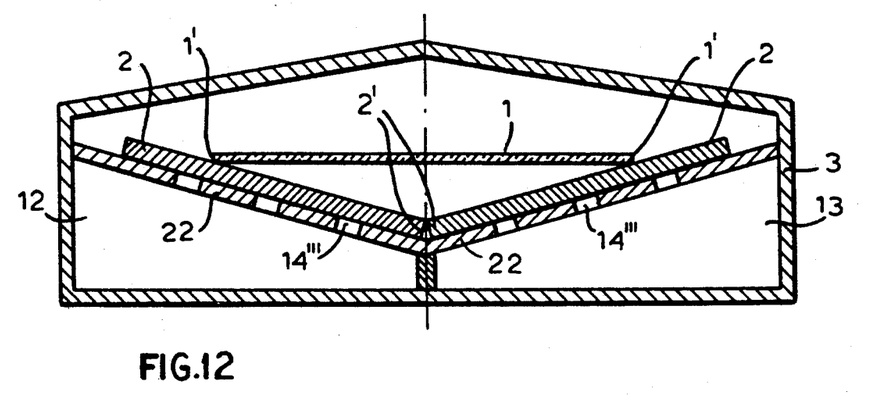
Figure 13:
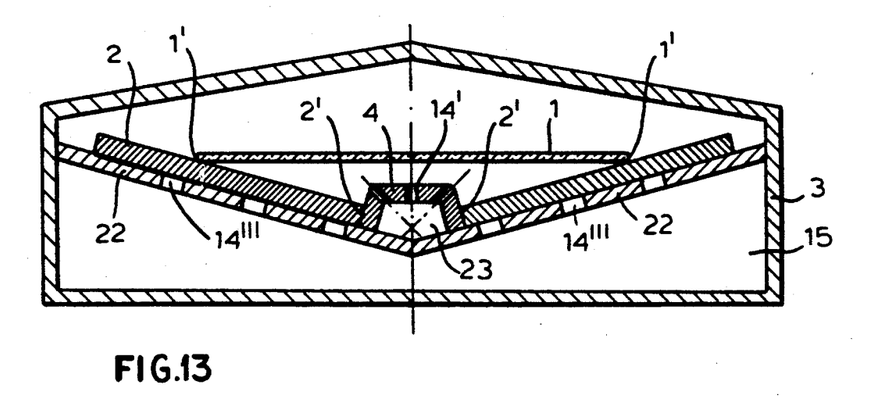

In connection with the process gas guidance for the bottom side of the substrate 1, the muffle 3, optionally including the slide rails 3', can also form a hollow space 15 underneath the muffle bottoms 22, for the supply and evacuation of the process gas, whereby gas passage openings 14''' are provided in this case in the muffle bottoms 22. In cross section, the hollow space 15 can be a single-chamber or multi-chamber space. In FIG. 12 it is a two-chamber space with chambers 12, 13. In FIGS. 13 and 14, the process gas flow takes place over channel 23 formed by the support member 4 between the individual belts 2.

The evacuation of the process gas takes place through the hollow space 15 of the muffle 3. Such an additional lower process gas guidance for the bottom side of the substrate is important at least in the combustion zone of the continuous furnace. In FIG. 12, the process gas supply takes place over the left-side chamber 12 of the hollow space and the process gas evacuation takes place over the right-side chamber 13. Here also, this lower process gas flow is essential for the bottom side of the substrate, at least in the combustion zone.

Figure 10:
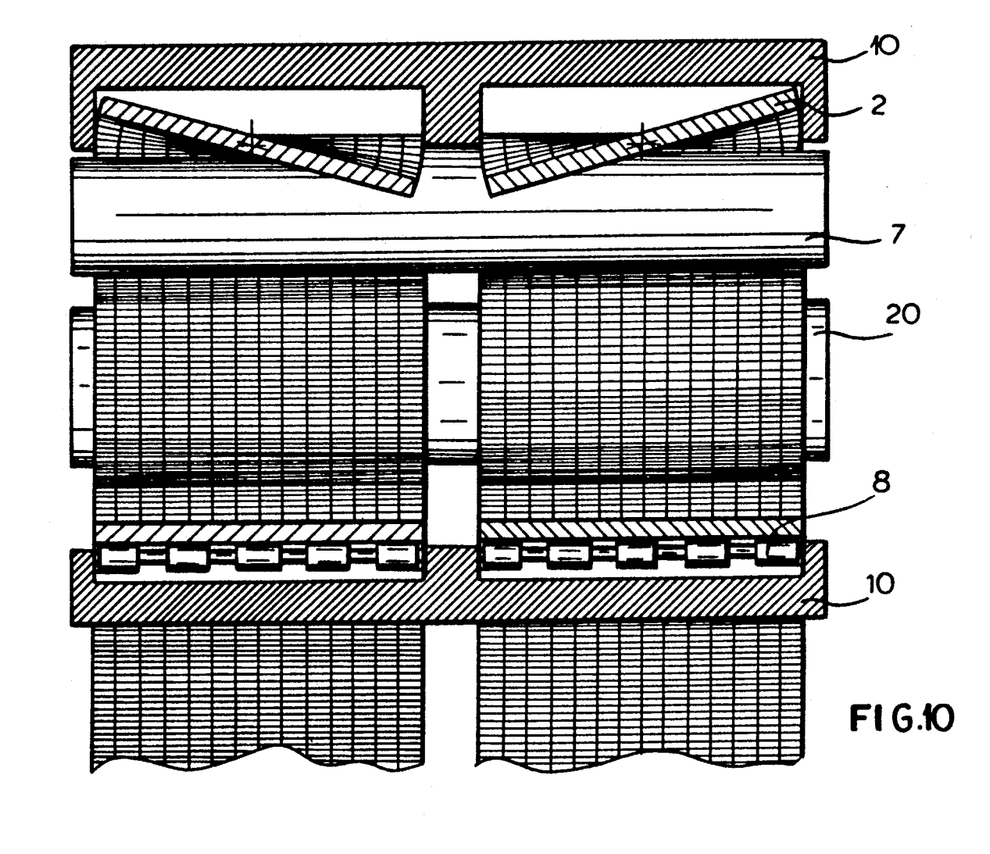

In the embodiments according to FIGS. 1 to 10, the individual belts 2 run over cylindrical guide rollers 7 with their horizontally supported axes, which are arranged at a distance in front and behind the muffle 3. The belt surface of each individual belt 2 is twisted about the neutral longitudinal thread or axis 2 (compare elements 2 and 22 in FIGS. 5–7), between the horizontal position at the guide rollers 7 and the inclined position prior to entering and in the muffle 3, which in successive belt cross sections connects their cross-sectional centers of gravity and in the case of homogeneous belt cross sections coincides with the longitudinal median of the individual belt. For this case, the guide rollers 7 are each commonly provided for both individual belts 2, so that both the neutral threads of the individual belts 2 run in the same plane which is approximately tangential to the shell of the guide rollers 7. The twisting or winding of the belt surface takes place under the influence of the belt weight. In addition, in the area of the twisting of their surfaces between the guide rollers 7 and the muffle 3, the individual belts 2 can be guided by cylindrical rollers 5, as in FIG. 6, or by fixed guiding devices 6, as in FIG. 7, which are arranged correspondingly to the respective inclination of the belt surface. In the empty belt area (return run) of the individual belts 2 the drive-, guiding- and support rollers 20, 25 provided there are arranged so that their axes run parallel to the guide rollers 7, which means they run horizontally. These drive-, guide- and/or support rollers 8, 20, 25 in the empty belt area can have flange rings 9 or annular spacers laterally guiding the individual belts 2 at their edges 2', 2". In the area of these drive-, guide and/or support rollers in the empty belt zone, it is also possible to provide fixed guiding devices 10, particularly for the lateral guidance of the belt (FIG. 10).

Figure 11:
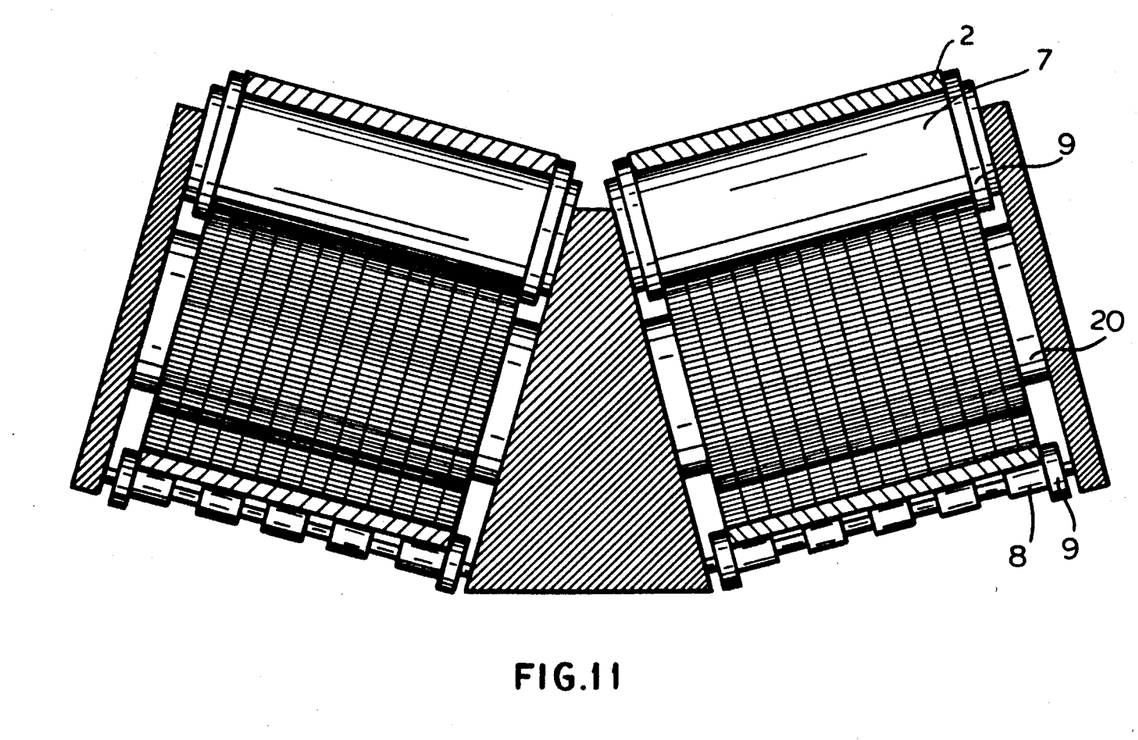

FIG. 11 shows an embodiment example wherein it is possible to eliminate the twisting, respectively winding of the belt surface of the individual belts 2 between the muffle 3 and the guide rollers 7 arranged in front and behind the muffle. In this case, all of the drive-, guide and/or support rollers guiding each individual belt 2 are inclined with their axes 7,8, 20, 25 with respect to the horizontal by the same angle as the belt surface in the muffle 3. The axes of the rolls, respectively rollers arranged in pairs at the two individual belts 2 form between them the same opening angle as inclination with respect to the horizontal of the belt surface in the muffle 3. Here also, the drive-, guide- and/or support rolls, respectively rollers have flange rings supporting and laterally guiding the individual belts 2 at least at their inner mutually facing edges 2.

Figure 15:
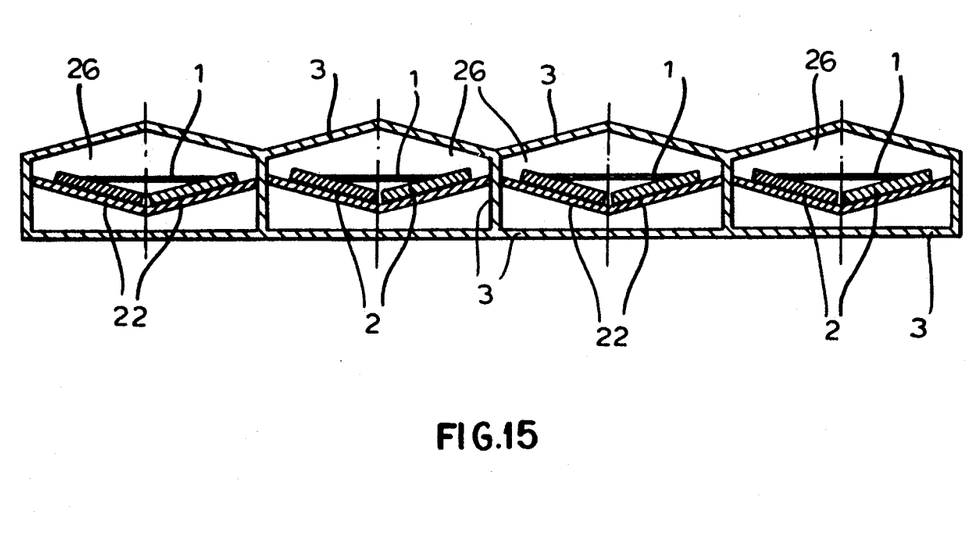

FIG. 15 shows the case of several pairs of individual belts running next to each other, which together form the conveyor belt. Each pair can be built and guided accordingly to FIGS. 1 to 14, whereby the particular possibility exists of creating in the muffle a separate muffle chamber 26 for each pair of belts, as shown in FIG. 15.

We claim:

1. A continuous furnace for the simultaneous two-sided sintering of sintered sheets upon substrates, comprising:

an elongated furnace muffle; and drivable conveyor belt means for supporting the substrates and longitudinally traversing the muffle and endlessly led back to the muffle outside the muffle, said drivable conveyor belt means comprising:

a pair of individual belts guided in parallel next to one another and running synchronously, means in said muffle including mutually inclined muffle bottoms extending the length of said muffle and on which said belt respectively lie for inclining belt surfaces of said individual belts in the muffle at a small angle to the horizontal, so that mutually facing inner edges of the individual belts run at a lower level than outer edges of the individual belts facing away from each other, the substrates being self-supporting between two parallel lateral edges of said substrate resting with one lateral edge on the belt surface of one of said individual belts and with a second lateral edge on the belt surface of the other individual belt, the belts being guided in said muffle on said muffle bottoms and means against which mutually facing inner edges of said belt surfaces directly rest for laterally supporting said belts against movement toward one another over substantially entire lengths thereof in said muffle, the two individual belts being supported at their mutually facing inner edges of their inclined belt surfaces by a supporting member provide between the individual belts, each of said individual belts being independently guided on said support member, the support member seen in cross section having a channel for a process gas, gas passage openings being provided in a wall of the channel.

2. The continuous furnace according to claim 1 wherein the two individual belts are inclined by the same angle with respect to the horizontal in said muffle.

3. The continuous furnace according to claim 1 wherein the two individual belts are of equal width.

4. The continuous furnace according to claim 1 wherein the inclined surfaces of the two individual belts define between them an opening angle of 80° to 170°.

5. The continuous furnace according to claim 1 wherein in the muffle the inclined belt surfaces of the individual belts each constitute planar surfaces.

6. The continuous furnace according to claim 1 wherein each of the muffle bottoms has a planar surface.

7. The continuous furnace according to claim 1 wherein the supporting member is arranged on a bottom of said muffle.

* * * * *